US010475664B2

(12) United States Patent
Cahill et al.

(10) Patent No.: US 10,475,664 B2
(45) Date of Patent: Nov. 12, 2019

(54) WAFER STACKING TO FORM A MULTI-WAFER-BONDED STRUCTURE

(71) Applicant: Raytheon Company, Waltham, MA (US)

(72) Inventors: Andrew Cahill, Goleta, CA (US); Jonathan Getty, Goleta, CA (US); Daniel D. Lofgreen, Santa Maria, CA (US); Paul A. Drake, Murrieta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/820,839

(22) Filed: Nov. 22, 2017

(65) Prior Publication Data

US 2018/0096833 A1    Apr. 5, 2018

Related U.S. Application Data

(62) Division of application No. 15/258,300, filed on Sep. 7, 2016, now abandoned.

(51) Int. Cl.
*H01L 21/02* (2006.01)
*H01L 21/67* (2006.01)
(Continued)

(52) U.S. Cl.
CPC ...... *H01L 21/324* (2013.01); *H01L 21/02282* (2013.01); *H01L 21/185* (2013.01); *H01L 21/187* (2013.01); *H01L 21/56* (2013.01); *H01L 21/67132* (2013.01); *H01L 21/6835* (2013.01); *H01L 21/6836* (2013.01)

(58) Field of Classification Search
CPC .................................................. H01L 21/0201
See application file for complete search history.

(56) References Cited

U.S. PATENT DOCUMENTS

| 5,672,545 A | 9/1997 | Trautt et al. |
| 5,804,771 A | 9/1998 | McMahon et al. |
| (Continued) | | |

FOREIGN PATENT DOCUMENTS

| CA | 2711266 A1 | 7/2009 |
| CA | 2709626 A1 | 12/2011 |
| (Continued) | | |

OTHER PUBLICATIONS

PCT International Search Report and Written Opinion dated Sep. 27, 2017 for International Application No. PCT/US2017/030796; 16 pages.

(Continued)

*Primary Examiner* — Moazzam Hossain
*Assistant Examiner* — Omar F Mojaddedi
(74) *Attorney, Agent, or Firm* — Daly, Crowley, Mofford & Durkee, LLP (57) ABSTRACT

In one aspect, a method includes heating a wafer chuck, heating a first wafer, depositing a first epoxy along at least a portion of a surface of the first wafer disposed on the wafer chuck, spinning the wafer chuck to spread the first epoxy at least partially across the first wafer, placing a second wafer on the first epoxy disposed on the first wafer and bonding the second wafer to the first epoxy under vacuum to form a two-wafer-bonded structure.

18 Claims, 6 Drawing Sheets

(51) Int. Cl.
*H01L 21/18* (2006.01)
*H01L 21/324* (2006.01)
*H01L 21/56* (2006.01)
*H01L 21/683* (2006.01)

(56) References Cited

U.S. PATENT DOCUMENTS

| | | | |
|---|---|---|---|
| 6,027,590 | A | 2/2000 | Sylvester et al. |
| 6,093,577 | A | 7/2000 | Van der Groen et al. |
| 7,863,758 | B2 | 1/2011 | Jung et al. |
| 8,084,288 | B2 | 12/2011 | Ginn et al. |
| 8,154,099 | B2 | 4/2012 | Hampp et al. |
| 2002/0134503 | A1* | 9/2002 | Hussinger ........... H01L 21/2007 156/331.4 |
| 2005/0000636 | A1 | 1/2005 | Geiger et al. |
| 2007/0155129 | A1* | 7/2007 | Thallner ........... H01L 21/67092 438/455 |
| 2010/0001188 | A1* | 1/2010 | Ginn ................. H01L 27/14618 250/338.4 |
| 2011/0042772 | A1* | 2/2011 | Hampp ............... H01L 23/3114 257/443 |
| 2012/0263946 | A1 | 10/2012 | Mitsukura et al. |
| 2013/0084459 | A1 | 4/2013 | Larson et al. |
| 2013/0316516 | A1* | 11/2013 | Deguchi ........... H01L 21/67121 438/455 |
| 2014/0011316 | A1* | 1/2014 | Park ........................ H01L 31/18 438/70 |
| 2015/0118784 | A1 | 4/2015 | Gerber et al. |

FOREIGN PATENT DOCUMENTS

| | | |
|---|---|---|
| JP | H03-41715 | 2/1991 |
| JP | 2009-237202 | 10/2015 |
| WO | WO 94/17557 | 8/1994 |
| WO | WO 2009/094558 A3 | 7/2009 |
| WO | WO 2012/118700 A1 | 9/2012 |
| WO | WO 2015/009801 A1 | 1/2015 |

OTHER PUBLICATIONS

Restriction Requirement dated Feb. 2, 2017 for U.S Appl. No. 15/258,300, 6 pages.
Response to Restriction Requirement dated Feb. 15, 2017 for U.S Appl. No. 15/258,300, 1 page.
Office Action dated Mar. 17, 2017 for U.S Appl. No. 15/258,300, 9 pages.
Response to Office Action dated Jun. 15, 2017 for U.S. Appl. No. 15/258,300, 7 pages.
U.S. Appl. No. 15/258,300, filed Sep. 7, 2016, Cahill et al.
Kim et al., "Low Temperature Epoxy Bonding for Wafer Level MEMS Packaging;" Proceedings from Sensors and Actuators A: Physical, vol. 132, Issue 2; May 2008; pp. 323-328 (6 Pages).
U.S. Non-Final Office Action dated Oct. 3, 2018 for U.S. Appl. No. 15/827,220; 7 Pages.
PCT International Search Report and Written Opinion dated Jul. 5, 2018 for PCT Application No. PCT/US2018/021967; 15 Pages.
U.S. Appl. No. 16/285,690, filed Feb. 26, 2019, Burkhart et al.
U.S. Notice of Allowance dated Feb. 8, 2019 for U.S. Appl. No. 15/827,220; 10 Pages.
PCT International Preliminary Report dated Mar. 21, 2019 for International Application No. PCT/US2017/030796; 8 Pages.
European 161/162 Communication dated May 10, 2019 for European Application No. 17723839.1; 3 Pages.
Response to U.S. Non-Final Office Action dated Oct. 3, 2018 for U.S. Appl. No. 15/827,220; Response filed Dec. 21, 2018; 10 Pages.

\* cited by examiner

WAFER STACKING TO FORM A MULTI-WAFER-BONDED STRUCTURE

CROSS REFERENCE TO RELATED APPLICATIONS

This application is a Divisional Application of and claims the benefit of U.S. patent application Ser. No. 15/258,300 filed Sep. 7, 2016, which is incorporated herein by reference in its entirety.

BACKGROUND

Flip chip devices are generally fabricated using integrated circuits (ICs) that are formed on a wafer. Pads are added to the surface of the ICs and solder balls are added to the pads. The ICs are removed (e.g., diced) from the wafer. Additional materials (sometimes called shim structures) are sometimes added to the flip chips to reduce flexing of the ICs, during heating and cooling or being exposed to mechanical stresses, for example. Then, the ICs are flipped and the solder balls are bonded to connectors of external circuitry.

SUMMARY

In one aspect, a method includes heating a wafer chuck, heating a first wafer, depositing a first epoxy along at least a portion of a surface of the first wafer disposed on the wafer chuck, spinning the wafer chuck to spread the first epoxy at least partially across the first wafer, placing a second wafer on the first epoxy disposed on the first wafer and bonding the second wafer to the first epoxy under vacuum to form a two-wafer-bonded structure.

In another aspect, a multi-wafer-bonded stack includes a first wafer and a second wafer bonded to the first wafer by a first epoxy. The first epoxy is free of voids.

DETAILED DESCRIPTION

Described herein are techniques used in stacking wafers to form a multi-wafer-bonded structure. Unlike traditional flip chip fabrication, additional material may be added at a wafer level (i.e., wafers are added) to the integrated circuits (ICs) to reduce flexing of the ICs, for example, during heating and cooling or being exposed to mechanical stresses as opposed to adding the additional material (e.g., shim structures) at an IC level. In one example, the process enables a large number of ICs (e.g., 40 ICs) to be handled at once. In one example, a multi-wafer-bonded structure is described herein that is thermally matched to the detector material. In another example, the multi-wafer bonded structure includes one or more bond layers (e.g., epoxy layers) that are uniform and free of voids (e.g., air gaps, air pockets, air bubbles and so forth). While the techniques described herein describe fabricating a three-wafer-bonded structure, the techniques described herein may be used to fabricate multi-wafer-bonded structurers having two or more wafers.

Figure 1:
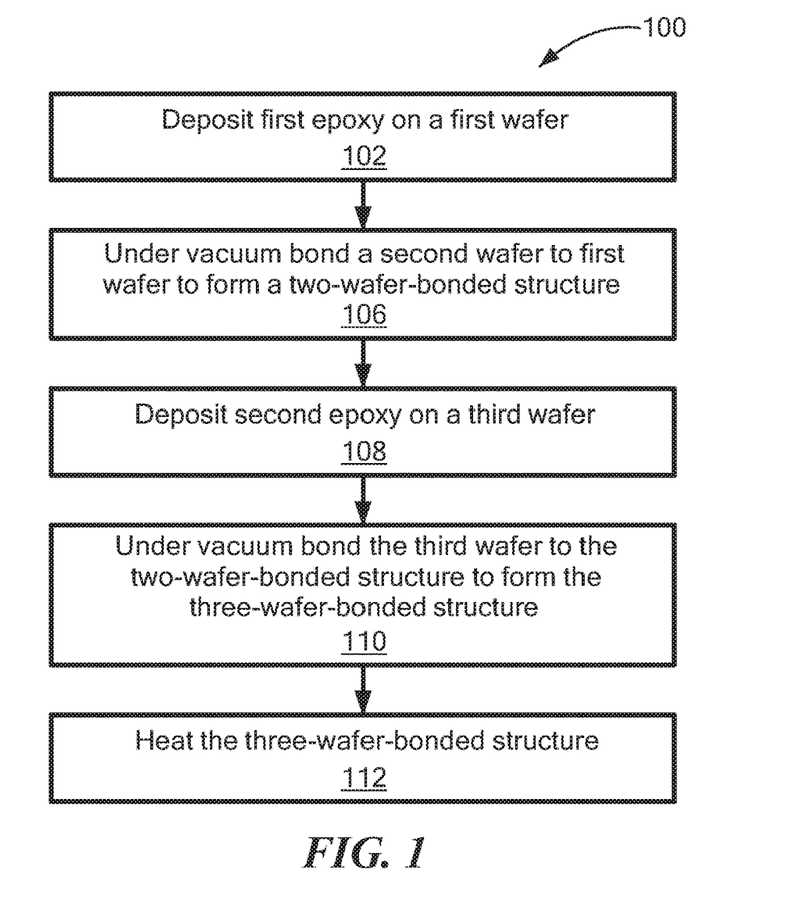
FIG. 1 is a flow diagram of an example of a process to stack wafers to form a multi-wafer-bonded structure.

Referring to FIG. 1, process 100 is an example of a process to stack wafers to form a multi-wafer-bonded structure. Process 100 deposits a first epoxy along at least a portion of a surface of a first wafer to form a first wafer structure (102). Process 100, under vacuum, bonds a second wafer to the first epoxy of the first wafer to form a two-wafer-bonded structure (106).

Process 100 deposits a second epoxy along at least a portion of a surface of a third wafer to form a second wafer structure (108). In one example, the second epoxy is applied to the third wafer using the same technique used in processing block 102. Process 100, under vacuum, bonds the second epoxy of the third wafer to the first wafer (110). In one example, the second epoxy of the third wafer is bonded to the first wafer using the same technique used in processing block 106. In one example, the first epoxy is the same material as the second epoxy.

Process 100 heats the three-wafer-bonded structure to cure the first and second epoxies (112).

In one example, the first and third wafers have about the same coefficient of thermal expansion (CTE), while the second wafer has a different CTE. In one example, the first, second and third wafers are 8-inch wafers; however, the processes described herein could be applied to a number of different-sized wafers. In some examples, thicknesses of the wafers selected may vary.

In one example, after process 100 is completed the three-wafer bonded structure is diced and attached to a detector.

Figure 2:
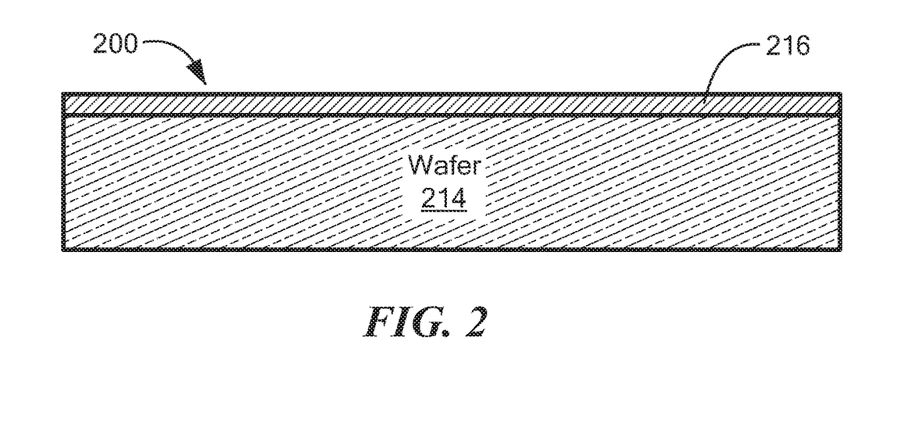
FIG. 2 is a diagram of an example of a first wafer with an epoxy.
Figure 3A:
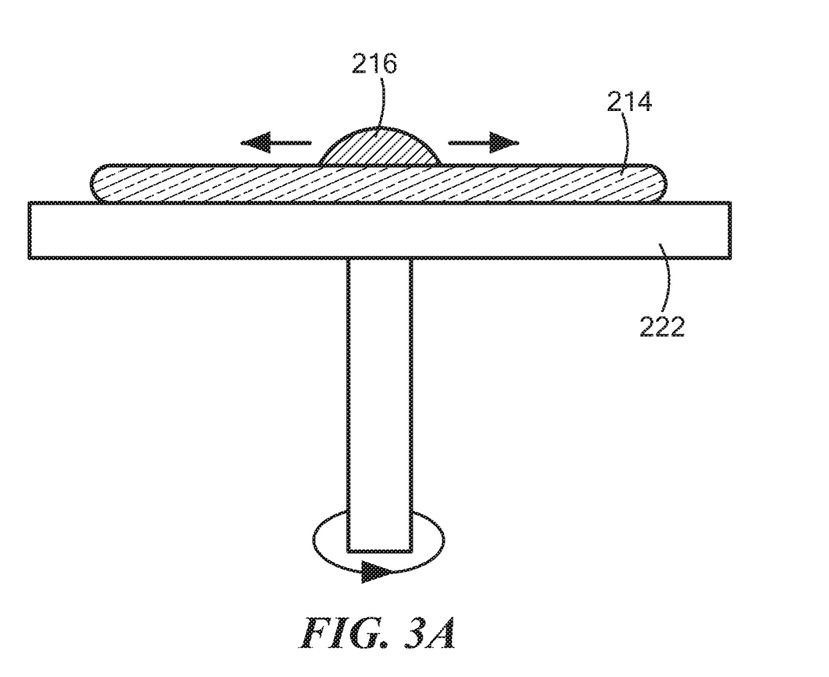
FIGS. 3A and 3B are diagrams of a wafer chuck used to apply the epoxy to the first wafer.
Figure 3B:
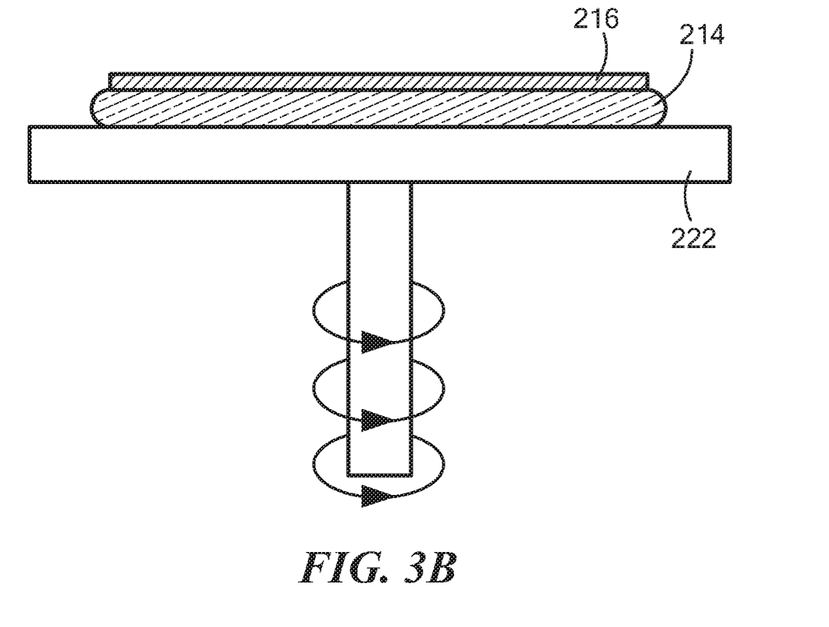

Referring to FIGS. 2, 3A and 3B, in one example, a one-wafer structure 200 is formed that includes a wafer 214 and an epoxy 216. In one example, the one-wafer structure 200 is formed by applying the epoxy 216 to a heated wafer 214 on a heated spinning wafer chuck 222 (FIG. 3A). In one example, the wafer chuck 222 and the wafer 214 are heated to about 65° C. In one example, the wafer chuck 222 and the wafer 214 are heated separately using a hot plate. In one example, the wafer chuck 222 spins at 500 rpms for 4 seconds as the epoxy is applied. In one example, the epoxy is a bonding epoxy that can withstand cryogenic temperatures (e.g., −150° C. or less).

The speed of the wafer chuck 222 is increased, for example, allowing the epoxy 216 to be evenly distributed across the wafer 214 (FIG. 3B). In one example, the wafer chuck 222 spins at 5,000 rpms for 30 seconds.

In one example, the wafer 214 is a controlled expansion (CE) wafer. In another example, the wafer 214 is a stainless steel wafer. In a further example, the wafer 214 is a titanium wafer.

Figure 4A:
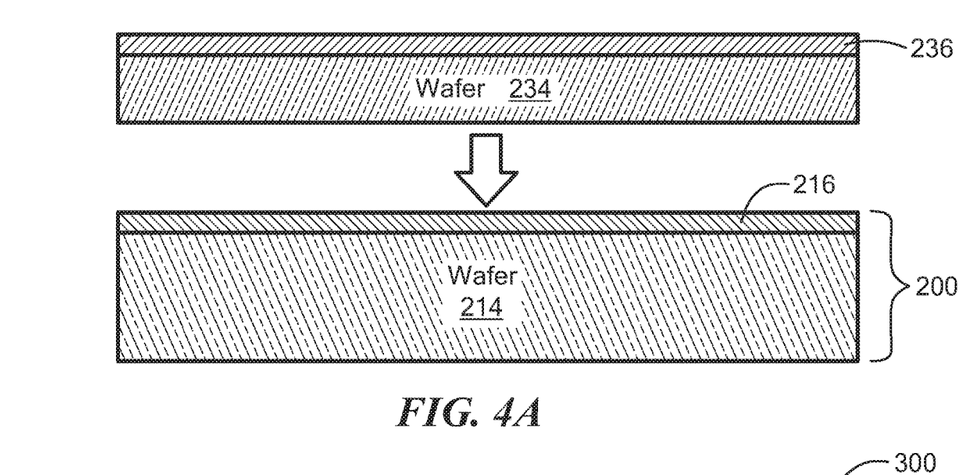
FIG. 4A is a diagram of a second wafer and the first wafer.
Figure 4B:
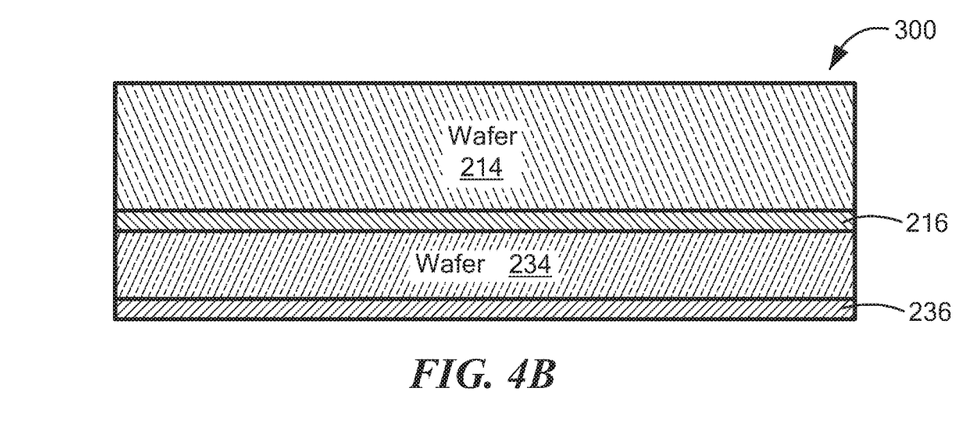
FIG. 4B is a diagram of the second wafer attached to the first wafer to form a two-wafer-bonded structure.

Referring to FIGS. 4A and 4B, a wafer 234 has a layer 236. The wafer 234 is applied to the wafer structure 200. In one example, the layer 236 includes bumps (e.g., indium bumps, not shown) covered with photoresist. In one example, the wafer 234 is a readout integrated circuit (ROIC) wafer. In one example, the bumps are used for bonding to external circuitry (not shown), for example, a detector (e.g., a flip chip device).

Prior to vacuum, contact between the wafer 234 and the epoxy 216 is minimized as much as possible. In one example, the wafer 234 is placed on or is positioned slightly above the epoxy 216. In one particular example, a centering ring (e.g., a centering ring 600 (FIG. 6)) is used to suspend the wafer 234 over the epoxy 216. For example, when the wafer 234 is allowed to naturally fall (e.g., from an inch or less above the epoxy 216) onto the surface of the epoxy 216, the wafer 234 is suspended by air pockets like a hockey puck on ice, for example. In another example, an arm, (e.g., a robotic arm) is used to suspend the wafer 234 over the epoxy 216. The wafer 234 and the wafer structure 200 are placed under vacuum (e.g., using a vacuum oven) so that the wafer 234 is bonded to the epoxy 216 to form a two-wafer-bonded structure 300 with no voids in the epoxy 216 as shown in FIG. 4B.

Figure 5A:
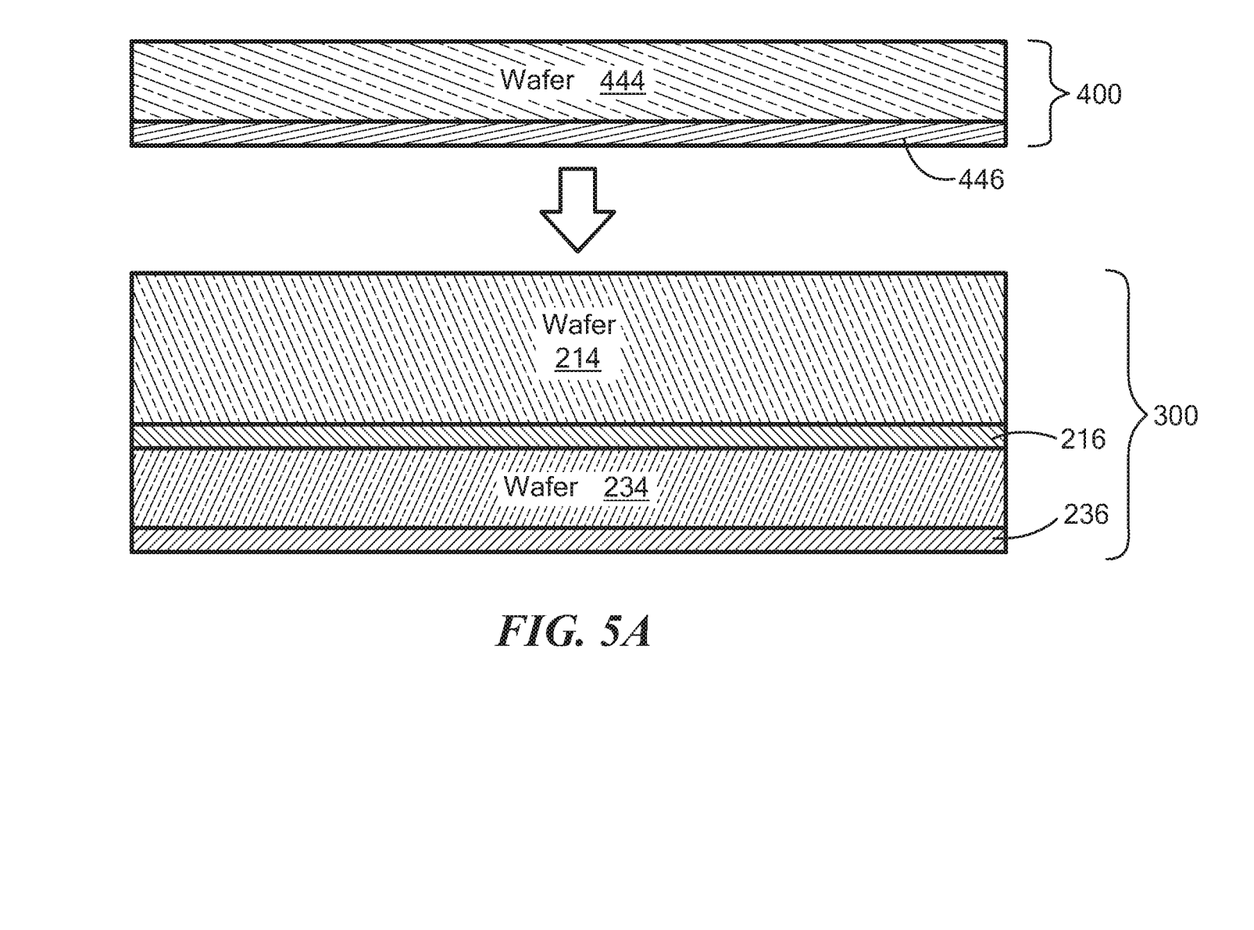
FIG. 5A is a diagram of a third wafer with epoxy and the two-wafer-bonded structure.
Figure 5B:
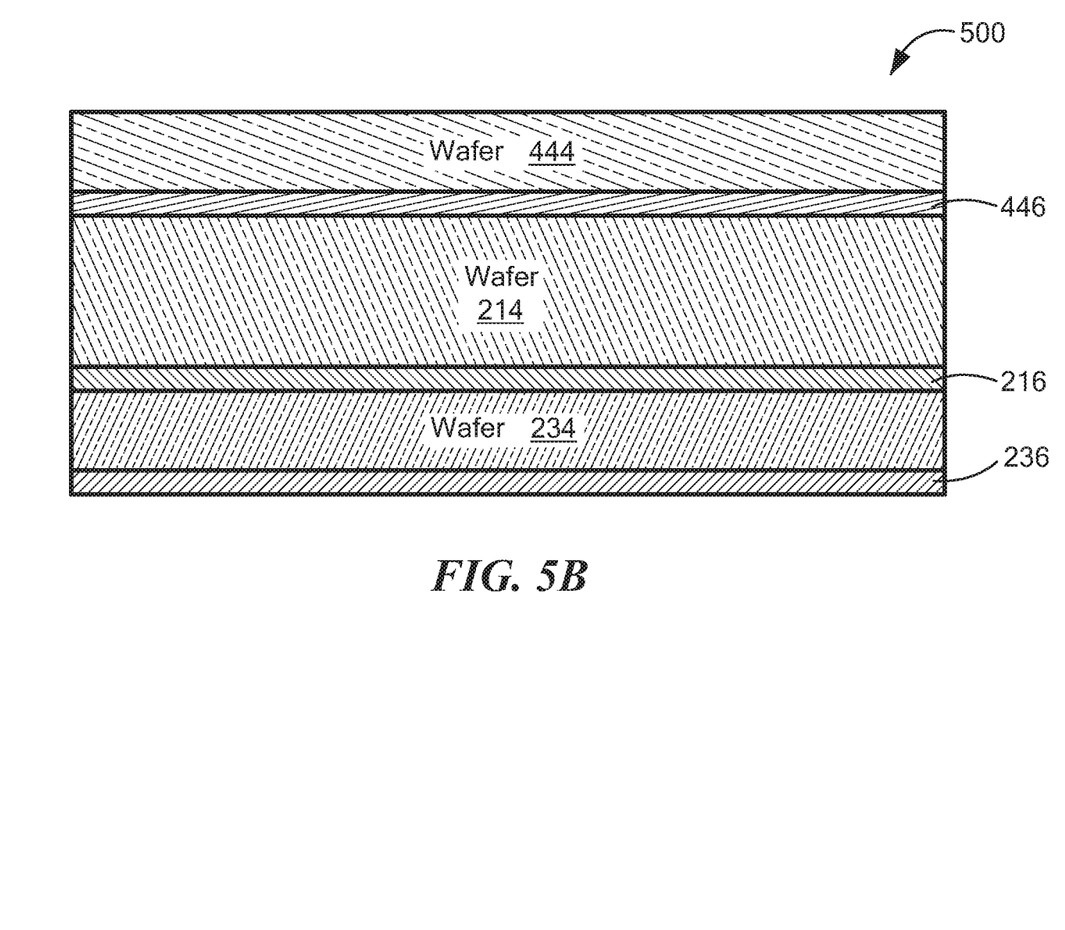
FIG. 5B is a diagram of the third wafer attached to the two-wafer-bonded structure to form a three-wafer-bonded structure.

Referring to FIGS. 5A and 5B, a one-wafer structure 400 includes a wafer 444 and an epoxy 446. In one example, the one-wafer structure 400 is formed in the same manner as the one-wafer structure 200 described herein. In one example, the epoxy 446 is about the same thickness as epoxy 216. In a further example, the epoxy is a bonding epoxy that can withstand cryogenic temperatures (e.g., −150° C. or less). In one example, the wafer 444 is a silicon wafer.

Prior to vacuum, contact between the wafer 214 and the epoxy 446 is minimized as much as possible. In one example, the epoxy-coated side of the wafer 444 is placed on or is positioned slightly above the wafer 214. In one particular example, a centering ring (e.g., the centering ring 600 (FIG. 6)) is used to suspend the wafer 444 over the wafer 214. The wafer structure 400 and the wafer structure 300 are placed under vacuum (e.g., using a vacuum oven) so that the wafer 214 is bonded to the epoxy 446 to form a three-wafer-bonded structure 500.

The three-wafer-bonded structure 500 is heated to cure the epoxy 216 and the epoxy 446. For example, the three-wafer-bonded structure 500 is heated using a hot plate.

Figure 6:
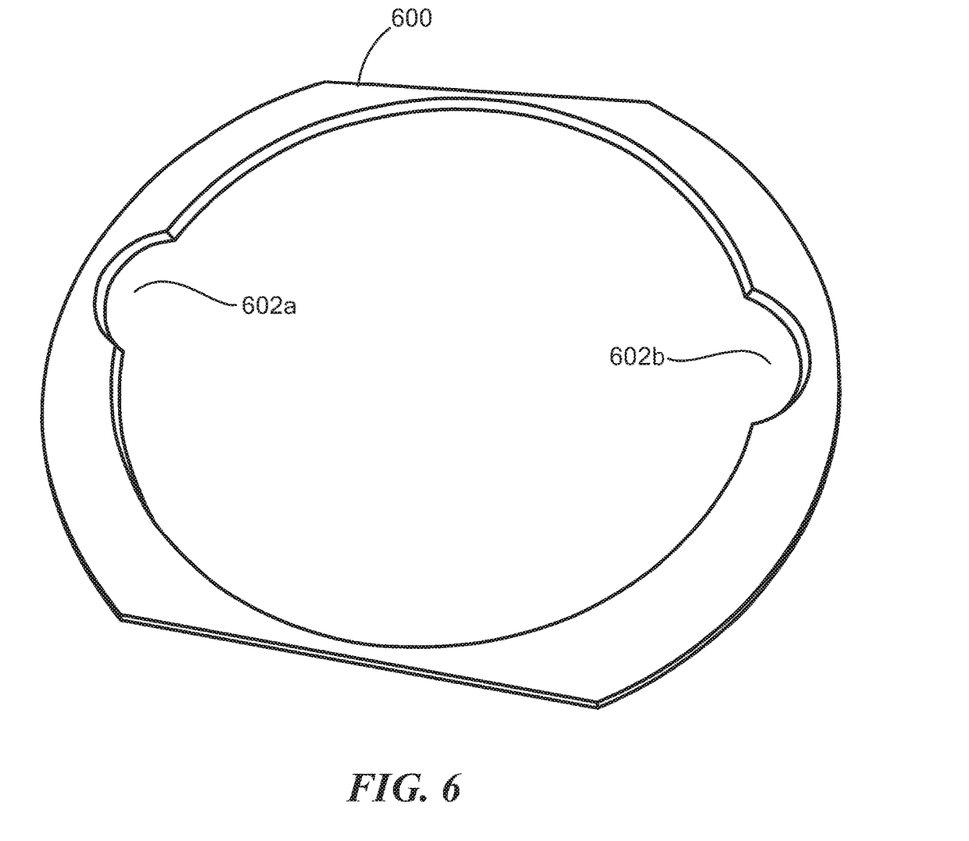
FIG. 6 is a diagram of a centering ring.

Referring to FIG. 6, one example of a centering ring is the centering ring 600. The centering ring includes gaps (e.g., a gap 602a, a gap 602b) used to allow a person to use fingers to center a wafer over another wafer or wafer structure (e.g., center the wafer 234 over the wafer structure 200, center the wafer 444 over the two-wafer structure 300 and so forth).

The processes described herein are not limited to the specific examples described. For example, while the processes described herein fabricate a three-wafer-bonded structure other techniques may be used to fabricate any wafer-bonded structure having two or more wafers. In other examples, the process 100 is not limited to the specific processing order of FIG. 1. Rather, any of the processing blocks of FIG. 1 may be re-ordered, combined or removed, performed in parallel or in serial, as necessary, to achieve the results set forth above.

The processes described herein are not limited to the specific embodiments described. Elements of different embodiments described herein may be combined to form other embodiments not specifically set forth above. Other embodiments not specifically described herein are also within the scope of the following claims.

What is claimed is:
1. A method, comprising:
heating a wafer chuck;
heating a first wafer having a coefficient of thermal expansion (CTE);
depositing a first epoxy along at least a portion of a surface of the first wafer disposed on the wafer chuck;
spinning the wafer chuck to spread the first epoxy at least partially across the first wafer;
placing a second wafer having a CTE different from the first wafer over the first epoxy disposed on the first wafer by using a centering ring having an opening that is sized to receive the second wafer, wherein the second wafer remains spaced apart from the first epoxy after the second wafer is placed over the first wafer; and
bonding the second wafer to the first epoxy under vacuum to form a two-wafer-bonded structure, wherein the second wafer comes in contact with the first epoxy as a result of the vacuum being applied to the first wafer and the second wafer.
2. The method of claim 1, further comprising:
heating a third wafer having a CTE the same as the first wafer;
depositing a second epoxy along at least a portion of a surface of the third wafer disposed on the wafer chuck;
spinning the wafer chuck to spread the second epoxy at least partially across the third wafer;
placing the second epoxy applied on the third wafer in contact with the first wafer of the two-wafer-bonded structure; and
bonding the second epoxy to the first wafer under vacuum to form a three-wafer-bonded structure.
3. The method of claim 2, further comprising reheating the wafer chuck to at least 65° C.
4. The method of claim 2, wherein heating the third wafer comprises heating the third wafer to at least 65° C.
5. The method of claim 2, wherein heating the third wafer comprises heating a silicon wafer.
6. The method of claim 2, wherein the three-wafer-bonded structure is heated to cure the first epoxy and the second epoxy.
7. The method of claim 2, wherein depositing the second epoxy along at least a portion of a surface of the third wafer disposed on the wafer chuck comprises depositing the second epoxy while the wafer chuck is spinning at a first speed, and
wherein spinning the wafer chuck to spread the second epoxy at least partially across the third wafer comprises increasing a speed of the wafer chuck from the first speed to a second speed.
8. The method of claim 2, wherein depositing the second epoxy comprises depositing a second epoxy comprising material used in the first epoxy.
9. The method of claim 1, wherein heating the wafer chuck comprises heating the wafer chuck to at least 65° C.
10. The method of claim 1, wherein heating the first wafer comprises heating a first wafer to at least 65° C.
11. The method of claim 1, wherein heating the first wafer comprises heating one of a controlled expansion (CE) wafer, a stainless steel wafer or a titanium wafer.
12. The method of claim 1, wherein placing the second wafer on the first epoxy comprises placing a readout integrated circuit (ROIC) wafer on the first epoxy.
13. The method of claim 12, wherein placing the ROIC wafer comprises placing an ROIC wafer comprising indium bumps.
14. The method of claim 1, wherein depositing the first epoxy along at least a portion of a surface of the first wafer disposed on the wafer chuck comprises depositing the first epoxy while the wafer chuck is spinning at a first speed.
15. The method of claim 14, wherein spinning the wafer chuck to spread the first epoxy across the first wafer comprises increasing a speed of the wafer chuck from the first speed to a second speed.
16. A method, comprising:
heating a wafer chuck;

heating a first wafer disposed on the wafer chuck;

depositing a first epoxy along at least a portion of a surface of the first wafer;

suspending, via a centering ring, a second wafer above the surface of the first wafer, the centering ring having an interior opening that is sized to receive the first wafer, the second wafer being suspended above the surface of the first wafer via one or more air pockets formed in the interior opening of the centering ring between the first wafer and the second wafer; and bonding the second wafer to the first epoxy.

17. The method of claim 16, wherein bonding the second wafer to the first epoxy comprises placing the first and second wafers under vacuum.

18. The method of claim 17, wherein the second wafer is suspended at a first height above the surface of the first wafer before the first and second wafers are under vacuum and wherein the second wafer is suspended at a second, shorter height above the surface of the first wafer after the first and second wafers are placed under vacuum.

* * * * *